United States Patent
Kim et al.

(10) Patent No.: US 10,629,130 B2
(45) Date of Patent: Apr. 21, 2020

(54) ORGANIC LIGHT-EMITTING DISPLAY DEVICE

(71) Applicant: SAMSUNG DISPLAY CO., LTD., Yongin-si, Gyeonggi-do (KR)

(72) Inventors: Dong Soo Kim, Yongin-si (KR); Joong Soo Moon, Yongin-si (KR); Won Kyu Kwak, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/666,795

(22) Filed: Aug. 2, 2017

(65) Prior Publication Data

US 2018/0061324 A1    Mar. 1, 2018

(30) Foreign Application Priority Data

Aug. 23, 2016   (KR) .......................... 10-2016-0107024

(51) Int. Cl.
*G09G 3/3266* (2016.01)
*G09G 3/3233* (2016.01)
(Continued)

(52) U.S. Cl.
CPC ......... *G09G 3/3266* (2013.01); *G09G 3/3233* (2013.01); *G09G 3/3275* (2013.01);
(Continued)

(58) Field of Classification Search
CPC ... G09G 2300/0819; G09G 2300/0842; G09G 2310/0262; G09G 2310/0272;
(Continued)

(56) References Cited

U.S. PATENT DOCUMENTS 7,564,452 B2 *   7/2009   Komiya ................. G09G 3/006
                                                         345/204
8,803,770 B2    8/2014   Jeong et al.
(Continued)

FOREIGN PATENT DOCUMENTS

EP          3258463 A1      12/2017
EP          3 273 436       1/2018
(Continued)

OTHER PUBLICATIONS

Extended European Search Report was issued from the European Patent Office dated Jan. 30, 2018 with respect to the European Patent Application No. 17187431.6.
(Continued)

*Primary Examiner* — Michael J Jansen, II
(74) *Attorney, Agent, or Firm* — Kile Park Reed & Houtteman PLLC

(57) ABSTRACT

A display device includes a scan driver supplying a scan signal to scan lines, an emission control driver supplying an emission control signal to emission control lines, and a data driver supplying data signals to data lines coupled to pixels. Each pixel includes a drive transistor controlling an amount of current from a first power supply to a second power supply via an organic light-emitting diode, and three other transistors. The third transistor is turned on by a scan signal on a prior scan line and receives a voltage of a third power supply. The first and second transistors are turned on by a scan signal on a present scan line. The fourth power supply is different from the second and third power supplies, and the first and third transistors receive voltages of their respective power supplies through different power lines on different layers.

16 Claims, 7 Drawing Sheets

(51) Int. Cl.
*H01L 27/32* (2006.01)
*G09G 3/3275* (2016.01)

(52) U.S. Cl.
CPC . *H01L 27/3276* (2013.01); *G09G 2300/0819* (2013.01); *G09G 2310/0262* (2013.01); *G09G 2320/0233* (2013.01); *G09G 2320/0238* (2013.01); *H01L 27/3297* (2013.01)

(58) Field of Classification Search
CPC ....... G09G 2310/0289; G09G 2310/08; G09G 2320/0214; G09G 2320/0233; G09G 2320/0238; G09G 3/3233; G09G 3/3266; G09G 3/3275; G09G 2300/0439; G09G 2300/0465; H01L 27/3276; H01L 27/3288; H01L 27/3297
See application file for complete search history.

(56) References Cited

U.S. PATENT DOCUMENTS

| | | | | |
|---|---|---|---|---|
| 8,816,362 B2* | 8/2014 | Choi | ............... | H01L 27/3276 257/40 |
| 8,907,870 B2* | 12/2014 | Kang | ............... | G09G 3/3233 345/76 |
| 9,092,080 B2* | 7/2015 | Hyeon | ............... | G06F 3/038 |
| 9,224,329 B2* | 12/2015 | Kim | ............... | G09G 3/3233 |
| 9,224,972 B2* | 12/2015 | Shin | ............... | H05B 33/0803 |
| 9,349,782 B2* | 5/2016 | Hong | ............... | H01L 27/3265 |
| 9,378,675 B2* | 6/2016 | Kim | ............... | G09G 3/3233 |
| 9,412,299 B2* | 8/2016 | Miyazawa | ......... | G09G 3/3258 |
| 9,741,287 B2* | 8/2017 | Na | ............... | G09G 3/3233 |
| 9,747,839 B2* | 8/2017 | Wang | ............... | G09G 3/3233 |
| 9,786,229 B2* | 10/2017 | Lee | ............... | G09G 3/3225 |
| 9,792,853 B2* | 10/2017 | Jeon | ............... | G09G 3/3233 |
| 9,972,242 B2* | 5/2018 | Lim | ............... | G09G 3/3233 |
| 10,032,413 B2* | 7/2018 | Kim | ............... | G09G 3/3241 |
| 10,140,919 B2* | 11/2018 | Nonaka | ............. | G09G 3/3233 |
| 10,319,306 B2* | 6/2019 | Jeong | ............... | G09G 3/3258 |
| 10,431,154 B2* | 10/2019 | Tsai | ............... | G09G 3/3233 |
| 2006/0244695 A1* | 11/2006 | Komiya | ............. | G09G 3/006 345/76 |
| 2008/0218455 A1* | 9/2008 | Yamamoto | ............. | G09G 3/325 345/76 |
| 2010/0265166 A1* | 10/2010 | Kang | ............... | G09G 3/3233 345/76 |
| 2011/0025659 A1* | 2/2011 | Kwak | ............... | G09G 3/3233 345/205 |
| 2011/0227098 A1* | 9/2011 | Choi | ............... | H01L 27/3276 257/88 |
| 2013/0088417 A1* | 4/2013 | Kim | ............... | G09G 3/3233 345/82 |
| 2013/0201172 A1 | 8/2013 | Jeong et al. | | |
| 2013/0257839 A1* | 10/2013 | Hyeon | ............... | G06F 3/038 345/212 |
| 2013/0328853 A1* | 12/2013 | Hong | ............... | H01L 27/3265 345/212 |
| 2014/0027719 A1 | 1/2014 | Kim | | |
| 2014/0070184 A1* | 3/2014 | Shin | ............... | H05B 33/0803 257/40 |
| 2014/0168188 A1* | 6/2014 | Jun | ............... | G09G 3/3291 345/212 |
| 2014/0353608 A1* | 12/2014 | Kim | ............... | G09G 3/3233 257/40 |
| 2015/0054812 A1* | 2/2015 | Jeon | ............... | G09G 3/3233 345/212 |
| 2015/0061538 A1* | 3/2015 | Miyazawa | ......... | G09G 3/3258 315/291 |
| 2015/0187279 A1* | 7/2015 | Lee | ............... | G09G 3/3225 257/40 |
| 2015/0294618 A1 | 10/2015 | Park et al. | | |
| 2015/0356920 A1* | 12/2015 | Na | ............... | G09G 3/3233 345/205 |
| 2016/0267843 A1* | 9/2016 | Wang | ............... | G09G 3/3233 |
| 2016/0351124 A1* | 12/2016 | Kim | ............... | G09G 3/3241 |
| 2016/0372037 A1* | 12/2016 | Lim | ............... | G09G 3/3233 |
| 2017/0365214 A1* | 12/2017 | Tsai | ............... | G09G 3/3233 |
| 2017/0365218 A1* | 12/2017 | Jeong | ............... | G09G 3/3258 |
| 2018/0006105 A1* | 1/2018 | Kim | ............... | G09G 3/3258 |
| 2018/0061324 A1* | 3/2018 | Kim | ............... | G09G 3/3275 |
| 2018/0068621 A1* | 3/2018 | Lee | ............... | G09G 3/3225 |
| 2018/0122297 A1* | 5/2018 | Nonaka | ............. | G09G 3/3233 |

FOREIGN PATENT DOCUMENTS

| | | |
|---|---|---|
| KR | 10-1152466 B1 | 5/2012 |
| KR | 10-2017-0143049 A | 12/2017 |

OTHER PUBLICATIONS

European Office Action for European Patent Application No. 17 187 431.6, dated Feb. 12, 2020.

\* cited by examiner

ORGANIC LIGHT-EMITTING DISPLAY DEVICE

CROSS-REFERENCE TO RELATED APPLICATION

Korean Patent Application No. 10-2016-0107024 filed on Aug. 23, 2016, and entitled: "Organic Light Emitting Display Device," is incorporated by reference herein in its entirety.

BACKGROUND

1. Field

One or more embodiments relate to an organic light-emitting display device.

2. Description of Related Art

A variety of displays have been developed. Examples include liquid crystal displays and organic light-emitting displays. Organic light-emitting displays generate image based on light emitted from organic light-emitting diodes. These displays are driven at low power consumption and have high response speed.

In an organic light-emitting display, pixels are coupled to data lines and scan lines. Each pixel includes a driving transistor for controlling the amount of current flowing through a organic light-emitting diode. The amount of current corresponds to a predetermined luminance and is based on a data signal.

Attempts have been made to develop a display in which the organic light-emitting diodes emit light at low current. However, black luminance may occur in these circumstances. In addition, in attempt to achieve high luminance, a second power supply coupled to a cathode electrode of the organic light-emitting diode may be set to a relatively low voltage. However, as the voltage of the second power supply is reduced, the voltage of an initialization power supply is also reduced. Consequently, in each pixel, leakage current may flow from the gate electrode of the drive transistor to the initialization power supply. This may have an adverse effect on image quality.

SUMMARY

In accordance with one or more embodiments, an organic light-emitting display device includes pixels coupled to scan lines, data lines, and emission control lines; a scan driver to supply a scan signal to the scan lines; an emission control driver to supply an emission control signal to the emission control lines; and a data driver to supply data signals to the data lines.

Each of pixels in an i-th (i is a natural number) horizontal line includes an organic light-emitting diode including a cathode electrode coupled to a second power supply; a pixel circuit including a drive transistor to control an amount of current flowing from a first power supply to a second power supply via the organic light-emitting diode; a third transistor coupled between a third power supply and a gate electrode of the drive transistor, the third transistor to be turned on when the scan signal is supplied to an i−1-th scan line, the third transistor to receive a voltage of the third power supply through a third power line; a first transistor coupled between a fourth power supply and an anode electrode of the organic light-emitting diode, the first transistor to be turned on when the scan signal is supplied to an i-th scan line, the fourth power supply different from the third power supply and the second power supply, the first transistor to receive a voltage of the fourth power supply through a fourth power line; and a second transistor coupled between the data line and the pixel circuit, the second transistor to be turned on when the scan signal is supplied to the i-th scan line, and wherein the third-power-supply application line and the fourth-power-supply application line are on different layers.

The scan lines and the emission control lines may be on a substrate, the data lines are on a gate insulating layer on the scan liens and the emission control lines, and the organic light-emitting display device may include a first insulating layer, a second insulating layer, and a protective layer successively stacked on the gate insulating layer.

The third power line may be on the first insulating layer, and the fourth power line and the anode electrode may be on the protective layer. The fourth power line may include a same material as the anode electrode. The anode electrode may include a reflective layer on the protective layer; and a transparent conductive layer between the reflective layer and the protective layer or on the reflective layer.

The pixel circuit may include at least one fourth transistor coupled between the gate electrode of the drive transistor and a second electrode of the drive transistor, the at least one fourth transistor to be turned on based on the scan signal supplied to the i-th scan line; a fifth transistor coupled between a first electrode of the drive transistor and the first power supply, the fifth transistor to be turned off based on the emission control signal supplied to the i-th emission control line; and a sixth transistor coupled between the second electrode of the drive transistor and the anode electrode of the organic light-emitting diode, the sixth transistor to be turned off based on the emission control signal supplied to the i-th emission control line.

The emission control driver may supply the emission control signal to the fifth transistor through the i-th emission control line, and the emission control signal may overlap the scan signal supplied to the i−1-th scan line and the i-th scan line. The fourth power line may cover at least a portion of the third transistor or at least a portion of the fourth transistor. The fourth power line may include a reflective layer on the protective layer; and a transparent conductive layer between the reflective layer and the protective layer or on reflective layer. The second transistor may be coupled to the first electrode of the drive transistor.

The pixel circuit includes a storage capacitor coupled between the first power supply and the third transistor, and the storage capacitor may include a lower electrode on the gate insulating layer and an upper electrode on the first insulating layer. The third power line may be on a same layer as the upper electrode. The third power supply may e a first initialization power supply to initialize the gate electrode of the drive transistor, and the fourth power supply may be a second initialization power supply to initialize the anode electrode of the organic light-emitting diode. The third power supply may be output to a voltage higher than a voltage of the fourth power supply. The fourth power supply may be output to a voltage higher than the second power supply. The third power supply may be output to a voltage lower than each of the data signals.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
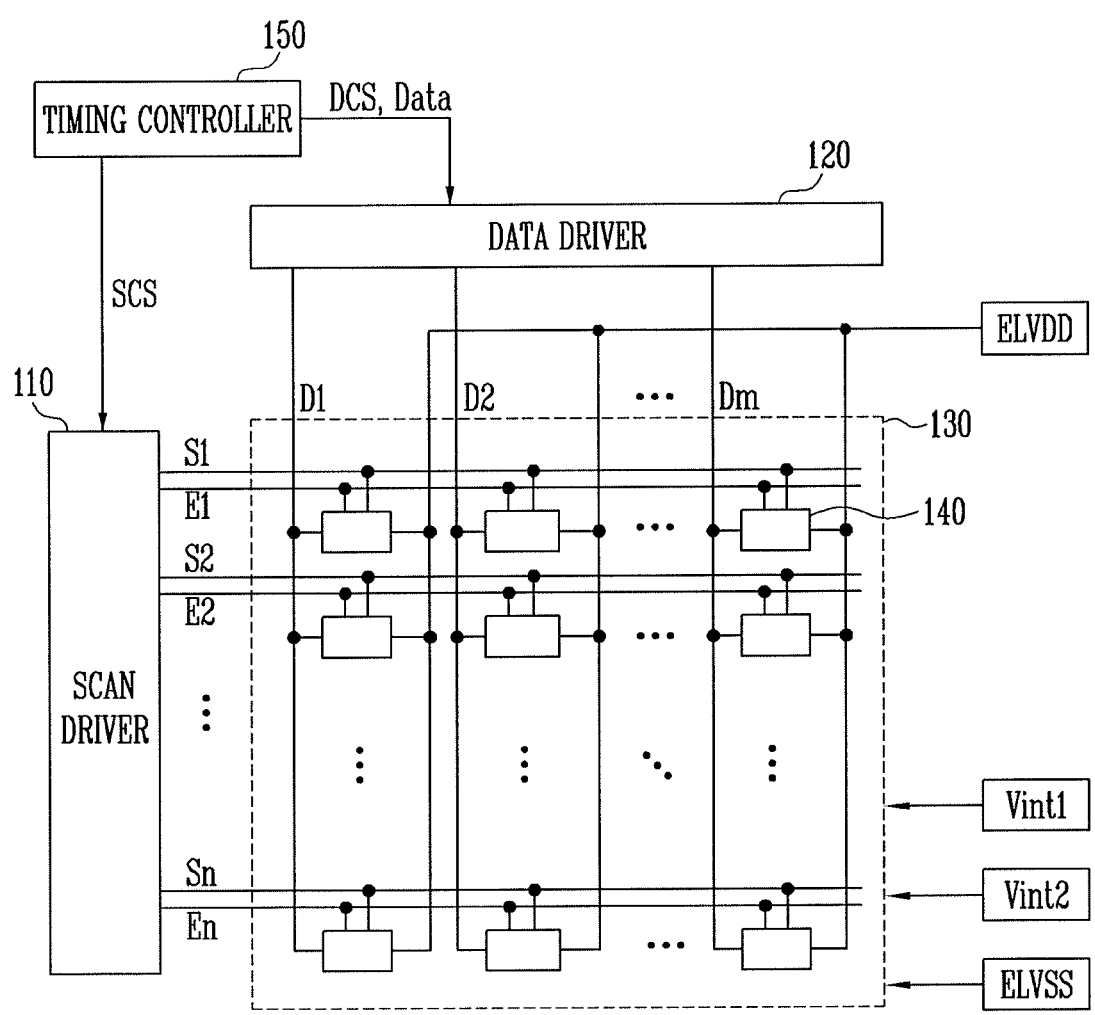
FIG. 1 illustrates an embodiment of an organic light-emitting display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of an organic light-emitting display device which may include pixels 140 coupled to scan lines S1 to Sn, emission control lines E1 to En, and data lines D1 to Dm, a scan driver 110 for driving the scan lines S1 to Sn and the emission control lines E1 to En, a data driver 120 for driving the data lines D1 to Dm, and a timing controller 150 for controlling the scan driver 110 and data driver 120.

The timing controller 150 may generate a data driving control signal DCS and a scan driving control signal SCS based on synchronization signals which are externally supplied. The data driving control signal DCS from the timing controller 150 is supplied to the data driver 120. The scan driving control signal SCS is supplied to the scan driver 110. The timing controller 150 may realign externally supplied data Data and supply the realigned data to the data driver 120.

The scan driving control signal SCS may include start pulses and clock signals. The start pulses may control first timings of a scan signal and an emission control signal. The clock signals are used as a basis for shifting the start pulses.

The data driving control signal DCS may include a source start pulse and clock signals. The source start pulse may control the time at which the sampling of data starts. The clock signals are used as a basis for controlling a sampling operation.

The scan driver 110 may provide scan signals to the scan lines S1 to Sn based on the scan driving control signal SCS from the timing controller 150. For example, the scan driver 110 may sequentially provide scan signals to the scan lines S1 to Sn. When the scan signals are sequentially provided to the scan lines S1 to Sn, the pixels 140 are selected on a horizontal line basis.

The scan driver 110 supplied with the scan driving control signal SCS may provide emission control signals to the emission control lines E1 to En. For example, the scan driver 110 may sequentially provide emission control signals to the emission control lines E1 to En. The emission control signals are used to control light-emitting times of the pixels 140. In an embodiment, the emission control signal may have a greater width than the scan signal. The scan driver 110 may provide scan signals to an i−1-th (i is a natural number) scan line Si−1 and an i-th scan line Si, for example, so that the scan signals overlap an emission control signal supplied to an i-th emission control line.

The scan driver 110 may be mounted on a substrate through a thin-film process. The scan driver 110 may be disposed on each of the opposite sides of a pixel unit 130. The scan driver 110 is illustrated as supplying the scan signals and the emission control signals in FIG. 1. In one embodiment, the scan signals and the emission control signals may be supplied by different drivers. The emission control signals may be set to a gate-off voltage (e.g., a high voltage) to turn off transistors in the pixels 140. The scan signals may be set to a gate-on voltage (e.g., a low voltage) to turn on the transistors in the pixels 140.

The data driver 120 may supply data signals to the data lines D1 to Dm based on the data driving control signal DCS. The data signals are provided to pixels 150 selected by a scan signal. In an embodiment, the data driver 120 may supply data signals to the data lines D1 to DM in synchronization with the scan signal.

The pixel unit 130 may include pixels 140 coupled to the scan lines S1 to Sn, the emission control lines E1 to En, and the data lines D1 to Dm. The pixels 140 are supplied with a first power supply ELVDD, a second power supply ELVSS, a third power supply Vint1, and a fourth power supply Vint2 from one or more sources outside the display device.

Each of the pixels 140 may include a drive transistor and an organic light-emitting diode (OLED). The drive transistor may control the amount of current that flows from the first power supply ELVDD to the second power supply ELVSS via the OLED based on a data signal. Before the data signal is supplied, a gate electrode of the drive transistor is initialized by a voltage of the third power supply Vint1. The third power supply Vint1 may be a first initialization power supply. The third power supply Vint1 may be set to a lower voltage than the data signal, so that the third power supply Vint1 initializes the gate electrode of the drive transistor.

When the data signal is supplied, an anode electrode of the OLED may be initialized by the fourth power supply Vint2. The fourth power supply Vint2 may be a second initialization power supply. The fourth power supply Vint2 may be set to a lower voltage than the third power supply Vint1. The fourth power supply Vint2 may be set to a higher voltage than the second power supply ELVSS.

In FIG. 1, n scan lines S1 to Sn and n emission control lines E1 to En are illustrated. In one embodiment, depending on a circuit configuration of the pixels 140, pixels 140 in the i-th horizontal line may be additionally coupled to a scan line (e.g., an i−1-th scan line) in a preceding horizontal line. In an embodiment, the pixel unit 130 may include additional dummy scan lines and/or dummy emission control lines.

Figure 2:
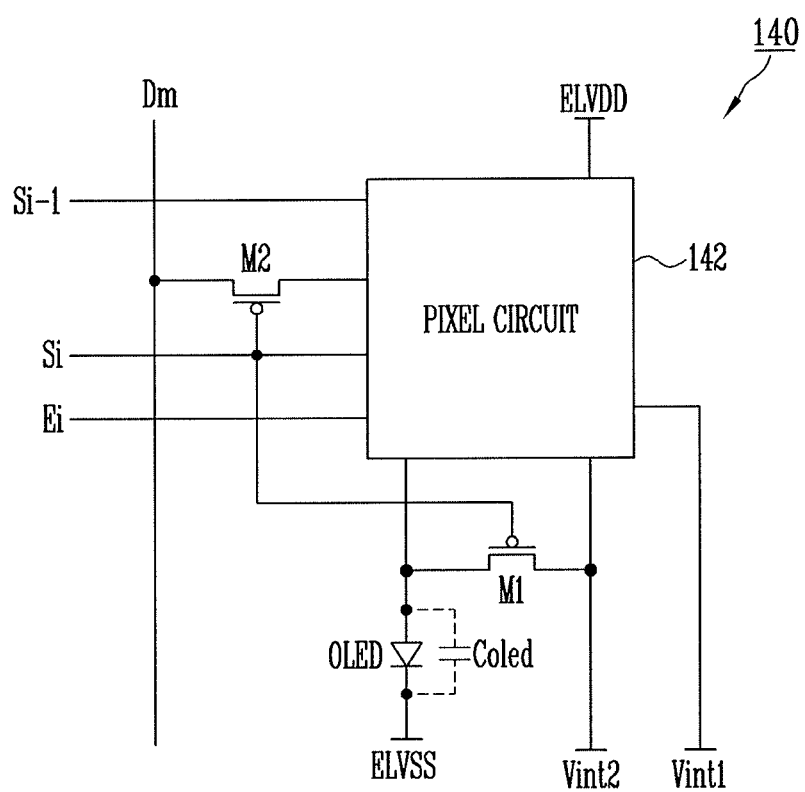
FIG. 2 illustrates an embodiment of a pixel.

FIG. 2 illustrates an embodiment of a pixel, which, for example, may be representative of the pixels 140 in FIG. 1.

For illustrative purposes only, the pixel 140 in FIG. 2 is illustrated as being coupled to an m-th data line DM and disposed in the i-th horizontal line.

Referring to FIG. 2, the pixel 140 may include a pixel circuit 142, an OLED, a first transistor M1, and a second transistor M2. The OLED may include an anode electrode coupled to the pixel circuit 142 and a cathode electrode coupled to the second power supply ELVSS. The OLED may emit light having a predetermined luminance corresponding to the amount of current supplied from the pixel circuit 142.

The pixel circuit 142 may initialize the gate electrode of the drive transistor to a voltage of the third power supply Vint1 when a scan signal is supplied to the i−1-th scan line Si−1. The pixel circuit 142 may be supplied with a data signal from the data line Dm, via the second transistor M2, when a scan signal is supplied to the i-th scan line Si. The pixel circuit 142 may control the amount of current flowing from the first power supply ELVDD to the second power supply ELVSS, via the OLED, when supply of the emission control signal to the i-th emission control line Ei is interrupted. The pixel circuit 142 may be implemented by various types of circuits which are supplied with the third power supply Vint1.

The first transistor M1 may be coupled between the anode electrode of the OLED and the fourth power supply Vint2. The gate electrode of the first transistor M1 may be coupled to the i-th scan line Si. When a scan signal is supplied from the i-th scan line Si, the first transistor M1 is turned on so that the voltage of the fourth power supply Vint2 may be supplied to the anode electrode of the OLED.

When the voltage of the fourth power supply Vint2 is supplied to the anode electrode of the OLED, a parasitic capacitor ("organic capacitor (Coled)") of the OLED is discharged. When the organic capacitor Coled is discharged, black expression performance may be enhanced. For example, during a preceding frame period, the organic capacitor Coled may charge a predetermined voltage corresponding to current from the pixel circuit 142. When the organic capacitor Coled is charged, the OLED may easily emit light even at low current.

During a current frame period, a black data signal may be supplied to the pixel circuit 142. When the black data signal is supplied to the pixel circuit 142, the pixel circuit 142 should not supply current to the OLED in an ideal case. However, in a practical situation, one or more transistors in pixel circuit 142 may supply a predetermined leakage current to the OLED, even when the black data signal is supplied to the pixel circuit 142. In this case, when the organic capacitor Coled is in a charged state, the OLED may emit a slight amount of light, thereby reducing black expression performance.

On the other hand, when the organic capacitor Coled is discharged by the fourth power supply Vint2 as described in the present embodiment, the OLED may be set to a non-emission state by leakage current. For example, in one embodiment, when a data signal is supplied to the pixel circuit 142, the fourth power supply Vint2 is applied to the anode electrode of the OLED, to thereby enhance black expression performance.

The fourth power supply Vint2 may be set to a lower voltage than a voltage of the third power supply Vint1 and higher than a voltage of the second power supply ELVSS, so that the organic capacitor Coled may be reliably discharged. For example, the fourth power supply Vint2 may be set to a voltage equal to or based on the sum of the threshold voltage of the OLED and the voltage of the second power supply ELVSS.

In an embodiment, when the third power supply Vint1 and the fourth power supply Vint2 are separated from each other, leakage current from the pixel circuit 142 may be reduced or minimized.

For example, to embody a high-luminance OLED, the voltage of the second power supply ELVSS coupled to the cathode electrode of the OLED may be reduced. When the voltage of the second power supply ELVSS is reduced, the amount of current supplied from the pixel circuit 142 to the OLED is increased, to thereby increase the luminance of light emitted from the OLED.

When the voltage of the second power supply ELVSS is reduced, the voltage of the fourth power supply Vint2 must be reduced. Therefore, when the third power supply Vint1 and the fourth power supply Vint2 are not separated from each other, leakage current flowing from the pixel circuit 142 to an initialization power supply is increased because the voltage of the second power supply ELVSS is reduced.

On the other hand, when the third power supply Vint1 and the fourth power supply Vint2 are separated from each other as in the present embodiment, the voltage of the third power supply Vint1 may be set regardless of the second power supply ELVSS2. In one embodiment, the third power supply Vint1 may be set to a voltage higher than a voltage of the second power supply ELVSS or the fourth power supply Vint2. As a result, leakage current flowing from the pixel circuit 142 to the third power supply Vint1 may be reduced or minimized.

When the fourth power supply Vint2 is set to a voltage higher than a voltage of the second power supply ELVSS, leakage current flowing from pixel circuit 142 to the fourth power supply Vint2 during a period ig which the OLED emits light may be reduced or minimized. The luminance of light emitted from the OLED may be enhanced.

Figure 3:
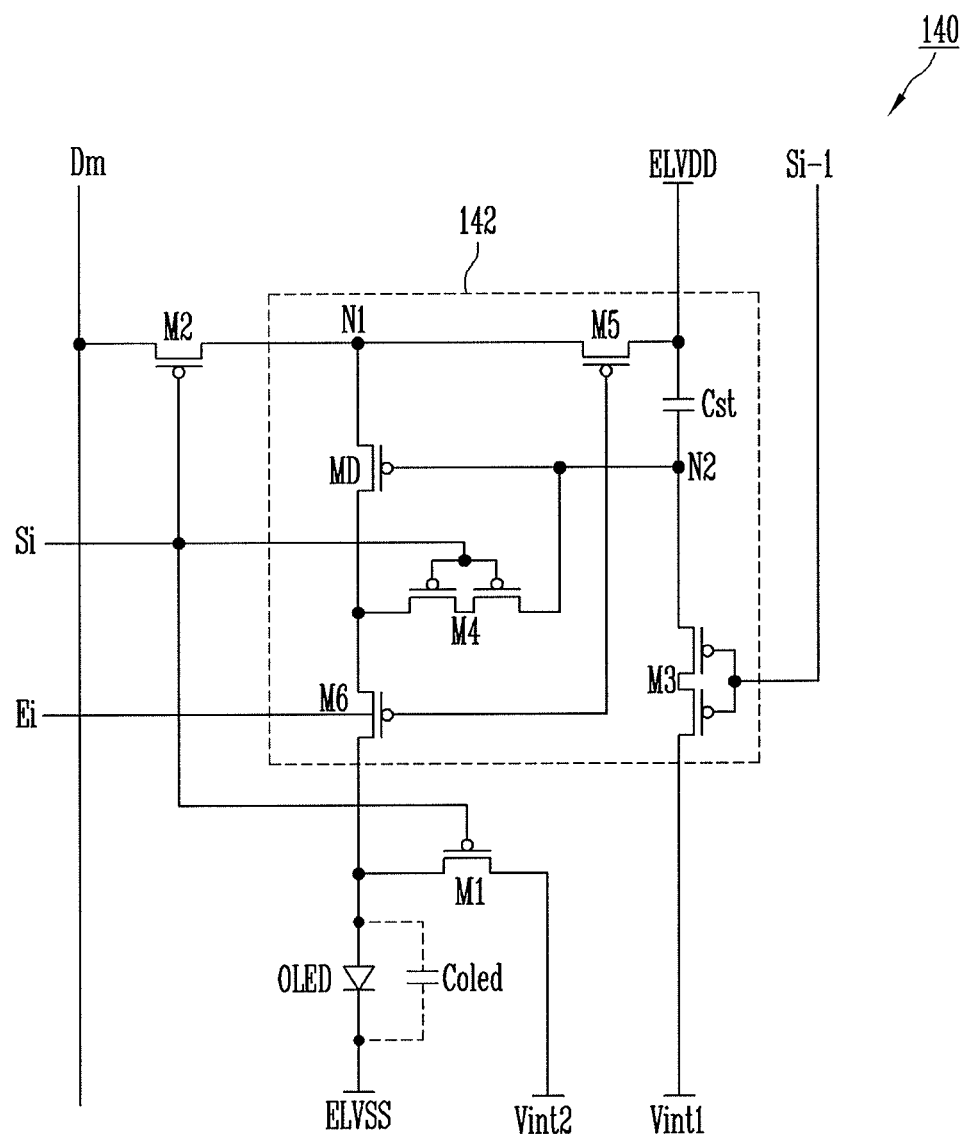
FIG. 3 illustrates an embodiment of a pixel circuit.

The second transistor M2 may be coupled between the data line Dm and the pixel circuit 142 (e.g., first node N1 in FIG. 3). A gate electrode of the second transistor M2 may be coupled to the i-th scan line Si. The second transistor M2 may be turned on when a scan signal is supplied to the i-th scan line Si, to supply the data signal from the data line Dm to the first node N1.

FIG. 3 illustrates an embodiment of a pixel circuit, which, for example, may correspond to the pixel circuit 142 in FIG. 2. Referring to FIG. 3, the pixel circuit 142 may include a drive transistor MD, a third transistor M3, a fourth transistor M4, a fifth transistor M5, a sixth transistor M6, and a storage capacitor Cst.

The drive transistor MD may include a first electrode coupled to the first node N1, a second electrode coupled to a first electrode of the sixth transistor M6, and a gate electrode coupled to a second node N2. The drive transistor MD may control the amount of current flowing from the first power supply ELVDD to the second power supply ELVSS, via the OLED, based on a voltage charged in the storage capacitor Cst.

The third transistor M3 may have, for example, a double-gate structure including a first electrode coupled to the second node N2, a second electrode coupled to the third power supply Vint1, and a gate electrode e coupled to the i−1-th scan line Si−1. When a scan signal is supplied to the i−1-th scan line Si−1, the third transistor M3 is turned on to supply the voltage of the third power supply Vint1 to the second node N2.

The fourth transistor M4 may have, for example, a double-gate structure including a first electrode coupled to the second electrode of the drive transistor MD, a second electrode coupled to the second node N2, and a gate electrode coupled to the i-th scan line Si. When a scan signal is supplied to the i-th scan signal Si, the fourth transistor M4 is turned on to place the drive transistor MD in a diode-connected state.

The fifth transistor M5 may include a first electrode coupled to the first power supply ELVDD, a second electrode coupled to the first node N1, and a gate electrode coupled to the emission control line Ei. The fifth transistor M5 may be turned off when an emission control signal is supplied to the emission control line Ei and turned on when an emission control signal is not supplied thereto.

The sixth transistor M6 may include the first electrode coupled to the second electrode of the drive transistor MD, a second electrode coupled to the anode electrode of the OLED, and a gate electrode coupled to the emission control line Ei. The sixth transistor M6 may be turned off when an emission control signal is supplied to emission control line Ei and turned on when an emission control signal is not supplied thereto.

The storage capacitor Cst may be coupled between the first power supply ELVDD and the second node N2. The storage capacitor Cst may charge a voltage corresponding to a data signal and a threshold voltage of the drive transistor MD. The transistors are illustrated as PMOS transistors. In another embodiment, one or more of the transistors may be NMOS transistors.

In the present embodiment, the OLED may generate light having various colors including red, green, and blue based on current from the drive transistor. The OLED may generate white light depending on the amount of current from the drive transistor. A separate color filter may be used to control the color of color generated from the OLED.

Figure 4:
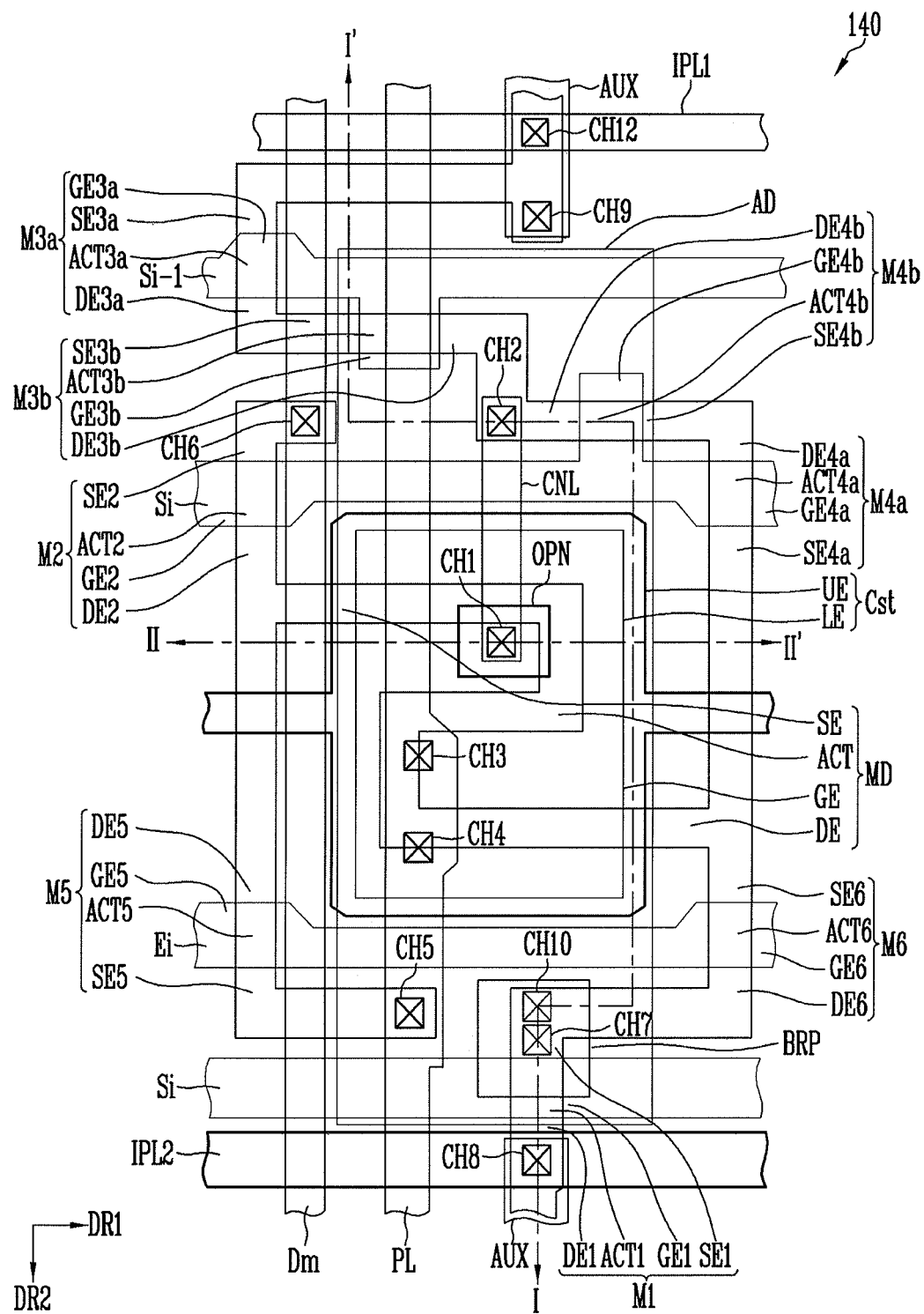
FIG. 4 illustrates a layout embodiment of a pixel.
Figure 5:
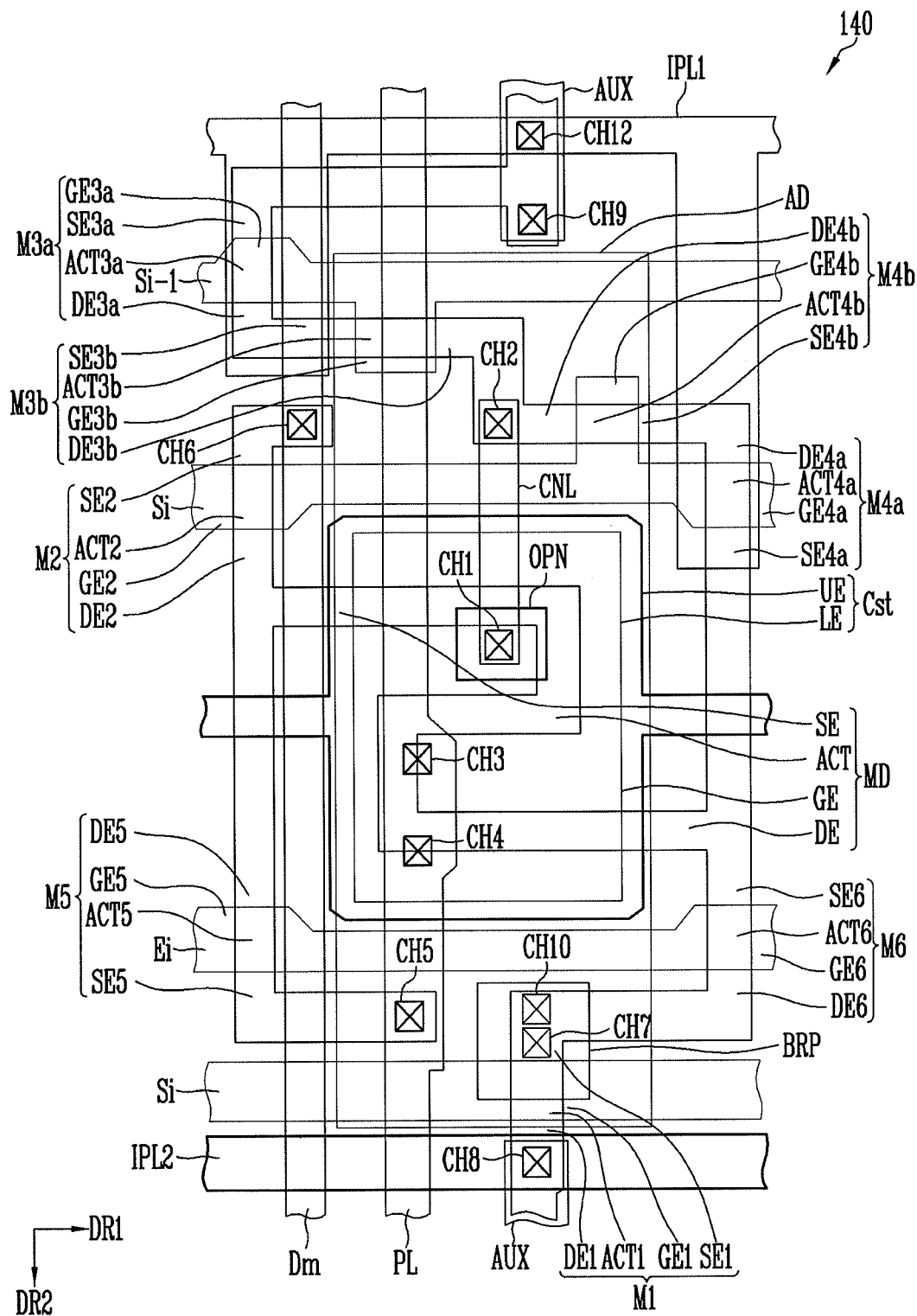
FIG. 5 illustrates another layout embodiment of the pixel.
Figure 6:
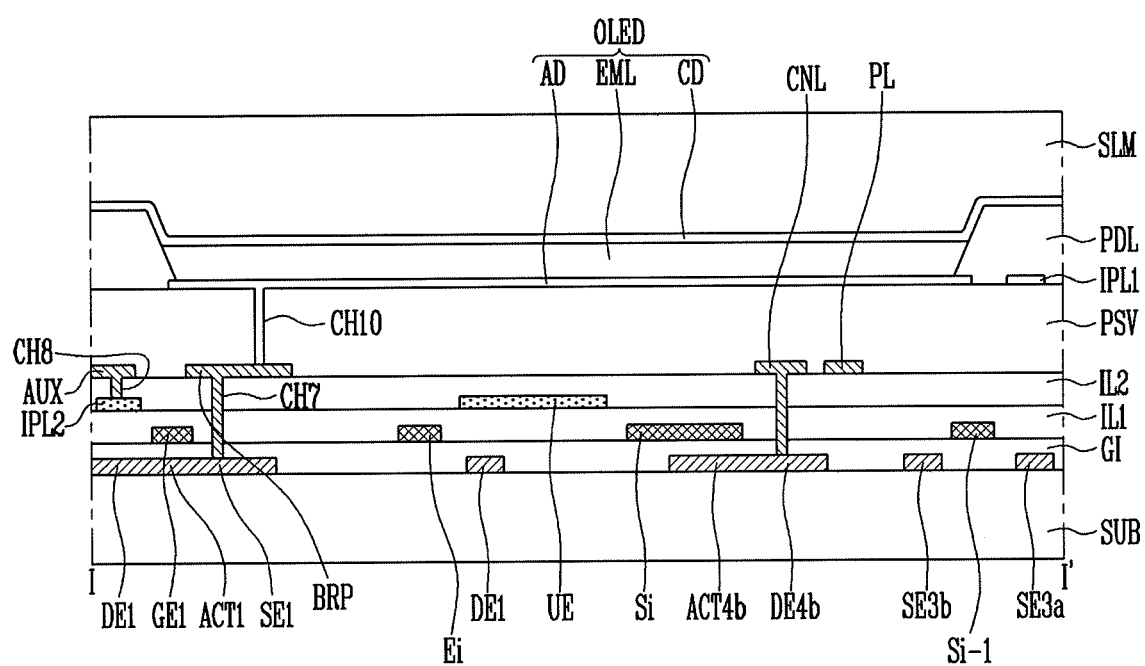
FIG. 6 illustrates a view along section line I-I' in FIG. 4.
Figure 7:
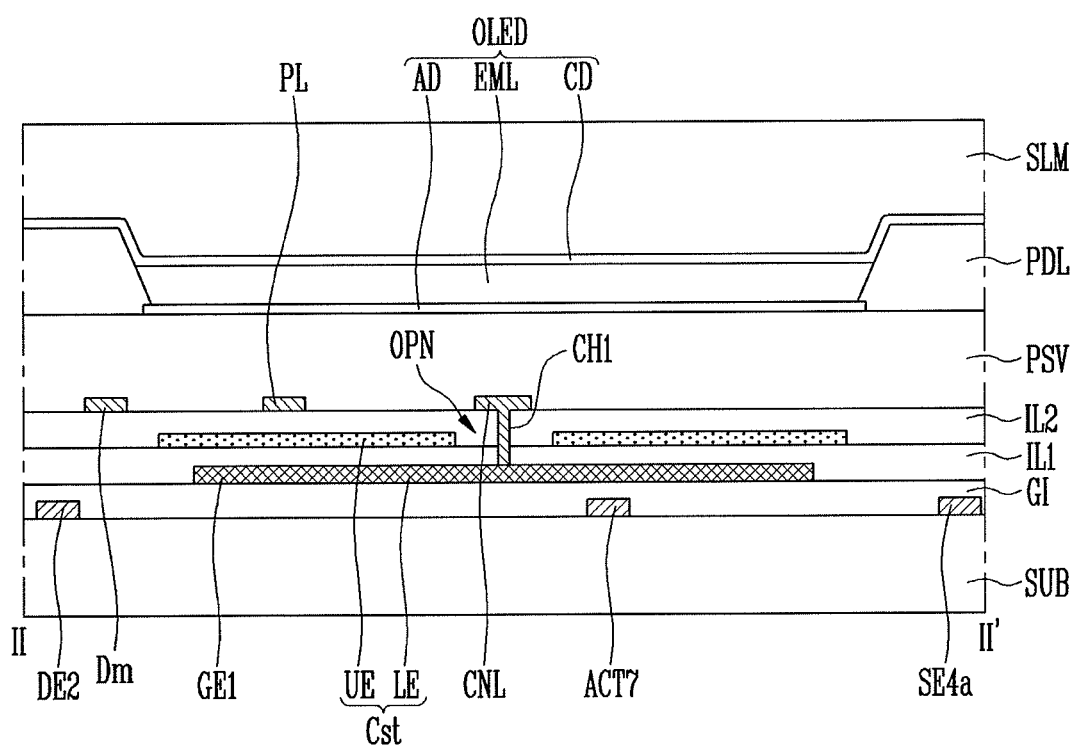
FIG. 7 illustrates a view along section line II-II' in FIG. 4.

FIG. 4 illustrates a layout embodiment of a pixel, which, for example, may represent the pixels 140 in FIGS. 1 to 3. FIG. 5 illustrates another layout embodiment of a pixel, which may represent the pixels 140 in FIGS. 1 to 3. FIG. 6 illustrates a sectional view taken along line I-I' in FIG. 4. FIG. 7 illustrates a sectional view taken along line II-II' in FIG. 4.

In FIGS. 4 to 7, pixel 140 is disposed in an i-th horizontal line and is coupled to the m-th data line Dm, and is coupled to two scan lines Si-1 and Si, an emission control line Ei, a power line PL and the data line Dm. For illustrative purposes, a scan line of an i-1-th horizontal line refers to "i-1-th scan line Si-1," a scan line of the i-th horizontal line refers to "i-th scan line Si," an emission control line of the i-th horizontal line refers to "emission control line Ei," an m-th data line refers to "data line Dm," and an m-th power line refers to "power line PL."

Referring to FIGS. 4 to 7, an organic light-emitting display device may include a substrate SUB, a line unit, and pixels 140. The substrate SUB may include transparent insulating material to allow light transmission. The substrate SUB may be, for example, a rigid substrate, e.g., a glass substrate, a quartz substrate, a glass ceramic substrate, and a crystalline glass substrate.

In one embodiment, the substrate SUB may be a flexible substrate, e.g., a film substrate or a plastic substrate which includes polymer organic material. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. The substrate SUB may include different materials (e.g., fiber reinforced plastic) in another embodiment.

The line unit may provide a signal to each of the pixels 140, and may include scan lines Si-1 and Si, a data line Dm, an emission control line E1i, a power line PL, a third power line IPL1, and a fourth power line IPL2.

The scan lines Si-1 and Si may extend in a first direction DR1. The scan lines Si-1 and Si may include the i-1-th scan line Si-1 and the i-th scan line Si successively arranged in a second direction DR2. Scan signals may be applied to the scan lines Si-1 and Si. For example, an i-1-th scan signal may be applied to the i-1-th scan line Si-1, and an i-th scan signal may be applied to the i-th scan line Si. The i-1-th scan line Si-1 may initialize the pixels 140 of the i-th horizontal line based on the i-1-th scan signal. The i-th scan line Si may bifurcate into two lines, and the two bifurcated i-th scan lines Si may be coupled to different transistors.

The emission control line Ei may extend in the first direction DR1. The emission control line Ei is between the two i-th scan lines Si at a position spaced apart from the i-th scan lines Si. The emission control line Ei may receive an emission control signal.

The data lines Dm may extend in the second direction DR2 and be successively arranged in the first direction DR1. Each data line Dm may receive a data signal.

The power line PL may extend in the second direction DR2. The power line PL may be at a position spaced apart from the data line Dm. The power line PL may be coupled to an upper electrode UE of the storage capacitor Cst through third and fourth contact holes CH3 and CH4 passing through a second insulating layer IL2. The first power supply ELVDD may be applied to the power line PL.

The third power line IPL1 and the fourth power line IPL2 may extend in the first direction DR1. The third power supply Vint1 may be applied to the third power line IPL1. The fourth power supply Vint2 may be applied to the fourth power line IPL2. The third power line IPL1 and the fourth power line IPL2 may be on the same horizontal line and may be shared between adjacent pixels.

Each of the pixels 140 may include first to sixth transistors M1 to M6, a drive transistor MD, a storage capacitor Cst, and an OLED. The drive transistor MD may include a gate electrode GE, an active pattern ACT, a source electrode SE, a drain electrode DE, and a connection line CNL.

The gate electrode GE may be coupled with a third drain electrode DE3 of the third transistor M3 and a fourth drain electrode DE4 of the fourth transistor M4. The connection line CNL may couple the gate electrode GE with the third and fourth drain electrodes DE3 and DE4. The connection line CNL has a first end coupled with the gate electrode GE through a first contact hole CH1 and a second end coupled with the third drain electrode DE3 and fourth drain electrode DE4 through a second contact hole CH2.

In one embodiment, each of the active pattern ACT, the source electrode SE, and the drain electrode DE may include an undoped semiconductor layer or a semiconductor layer doped with an impurity. For example, each of the source electrode SE and the drain electrode DE may include a semiconductor layer doped with an impurity. The active pattern ACT may include an undoped semiconductor layer.

The active pattern ACT may have a predetermined (e.g., bar) shape extending in a predetermined direction, and may be bent several or more times along the longitudinal direction. The active pattern ACT may overlap the gate electrode GE in a plan view. The active pattern ACT may be relatively long to increase the length or other size of a channel area of the drive transistor MD. As a result, the driving range of a gate voltage to be applied to the drive transistor MD is increased. Thus, the gradation of light emitted from the OLED may be controlled with great precision.

The source electrode SE may be coupled to a first end of the active pattern ACT, and may be coupled with a second drain electrode DE2 of the second transistor M2 and a fifth drain electrode DE5 of the fifth transistor M5. The drain electrode DE may be coupled to a second end of the active pattern ACT, and may be coupled with a fourth source electrode SE4 of the fourth transistor M4 and a sixth source electrode SE6 of the sixth transistor M6.

The second transistor M2 may include a second gate electrode GE2, a second active pattern ACT2, a second source electrode SE2, and a second drain electrode DE2. The second gate electrode GE2 may be coupled to the i-th scan line Si and may be provided as a part of the i-th scan line Si or formed to have a shape protruding from the i-th scan line Si. In one embodiment, each of the second active pattern ACT2, the second source electrode SE2, and the second drain electrode DE2 may include an undoped semiconductor layer or a semiconductor layer doped with an impurity. For example, each of the second source electrode SE2 and the second drain electrode DE2 may include a semiconductor layer doped with an impurity. The second active pattern ACT2 may include an undoped semiconductor layer. The second active pattern ACT2 may include a portion of the second transistor M2 overlapping the second gate electrode GE2.

The second source electrode SE2 may have a first end coupled to the second active pattern ACT2 and a second end coupled to the data line Dm through a sixth contact hole CH6. The second drain electrode DE2 may have a first end coupled to the second active pattern ACT2 and a second end coupled with the source electrode SE of the drive transistor MD and the fifth drain electrode DE5 of the fifth transistor M5.

The third transistor M3 may have, for example, a double-gate structure to prevent current leakage. The third transistor M3 may include a 3a-th transistor M3a and a 3b-th transistor M3b. The 3a-th transistor M3a may include a 3a-th gate electrode GE3a, a 3a-th active pattern ACT3a, a 3a-th source electrode SE3a, and a 3a-th drain electrode DE3a. The 3b-th transistor M3b may include a 3b-th gate electrode GE3b, a 3b-th active pattern ACT3b, a 3b-th source electrode SE3b, and a 3b-th drain electrode DE3b. The 3a-th gate electrode GE3a and the 3b-th gate electrode GE3b may be referred to as "third gate electrode GE3," and the 3a-th active pattern ACT3a and the 3b-th active pattern ACT3b may be referred to as "third active pattern ACT3." The 3a-th source electrode SE3a and the 3b-th source electrode SE3b may be referred to as "third source electrode SE3." The 3a-th drain electrode DE3a and the 3b-th drain electrode DE3b may be referred to as "third drain electrode DE3."

The third gate electrode GE3 may be coupled to the i−1-th scan line Si−1 and may be provided as a part of the i−1-th scan line Si−1 or formed to have a shape protruding from the i−1-th scan line Si−1. For example, the 3a-th gate electrode GE3a may be provided as a part of the i−1-th scan line Si−1. The 3b-th gate electrode GE3b may have a shape protruding from the i−1-th scan line Si−1.

Each of the third active pattern ACT3, the third source electrode SE3, and the third drain electrode DE3 may include an undoped semiconductor layer or a semiconductor layer doped with an impurity. For example, each of the third source electrode SE3 and the third drain electrode DE3 may include a semiconductor layer doped with an impurity. The third active pattern ACT3 may include an undoped semiconductor layer. The third active pattern ACT3 may correspond to a portion of the third transistor M3 that overlaps the third gate electrode GE3.

The third source electrode SE3 may have a first end coupled to the third active pattern ACT3 and a second end coupled to a first drain electrode DE1 of the first transistor M1 of the corresponding pixel on the third power line IPL1 and the i−1-th horizontal line. An auxiliary connection line AUX may be between the third source electrode SE3 and the first drain electrode DE1 of the first transistor M1 of the pixel in the i−1-th horizontal line. The auxiliary connection line AUX may have a first end coupled with the third source electrode SE3 through a ninth contact hole CH9, and a second end coupled to the third power line IPL1 of the i−1-th horizontal line through an eighth contact hole CH8 of the pixel in the i−1-th horizontal line. A portion of the auxiliary connection line AUX may be coupled to the third power line IPL1 through a twelfth contact hole CH12. The third drain electrode DE3 may have a first end coupled to the third active pattern ACT3 and a second end coupled to the fourth drain electrode DE4 of the fourth transistor M4. The third drain electrode DE3 may be coupled to the gate electrode GE of the drive transistor MD through the connection line CNL, the second contact hole CH2, and the first contact hole CH1.

The fourth transistor M4 may have, for example, a double-gate structure to prevent current leakage. For example, the fourth transistor M4 may include a 4a-th transistor M4a, and a 4b-th transistor M4b. The 4a-th transistor M4a may include a 4a-th gate electrode GE4a, a 4a-th active pattern ACT4a, a 4a-th source electrode SE4a, and a 4a-th drain electrode DE4a. The 4b-th transistor M4b may include a 4b-th gate electrode GE4b, a 4b-th active pattern ACT4b, a 4b-th source electrode SE4b, and a 4b-th drain electrode DE4b. The 4a-th gate electrode GE4a and the 4b-th gate electrode GE4b may be referred to as "fourth gate electrode GE4." The 4a-th active pattern ACT4a and the 4b-th active pattern ACT4b may be referred to as "fourth active pattern ACT4." The 4a-th source electrode SE4a and the 4b-th source electrode SE4b may be referred to as "fourth source electrode SE4." The 4a-th drain electrode DE4a and the 4b-th drain electrode DE4b may be referred to as "fourth drain electrode DE4".

The fourth gate electrode GE4 may be coupled to the i-th scan line Si. The fourth gate electrode GE4 may be provided as a part of the i-th scan line Si or have a shape protruding from the i-th scan line Si. For instance, the 4a-th gate electrode GE4a may have a shape protruding form the i-th scan line Si, and the 4b-th gate electrode GE4b may be formed as a part of the i-th scan line Si.

Each of the fourth active pattern ACT4, the fourth source electrode SE4, and the fourth drain electrode DE4 may include an undoped semiconductor layer or a semiconductor layer doped with an impurity. For example, each of the fourth source electrode SE4 and the fourth drain electrode DE4 may include a semiconductor layer doped with an impurity. The fourth active pattern ACT4 may include an undoped semiconductor layer. The fourth active pattern ACT4 may correspond to a portion of the fourth transistor M4 overlapping the fourth gate electrode GE4. The fourth source electrode SE4 may have a first end coupled to the fourth active pattern ACT4 and a second end coupled with the drain electrode DE of the drive transistor MD and the sixth source electrode SE6 of the sixth transistor M6. The fourth drain electrode DE4 may have a first end coupled to the fourth active pattern ACT4 and a second end coupled to the third drain electrode DE3 of the third transistor M3. The fourth drain electrode DE4 may be coupled to the gate electrode GE of the drive transistor MD through the connection line CNL, the second contact hole CH-12, and the first contact hole CH1.

The fifth transistor M5 may include a fifth gate electrode GES, a fifth active pattern ACTS, a fifth source electrode SE5, and the fifth drain electrode DE5. The fifth gate electrode GE5 may be coupled to the emission control line Ei. The fifth gate electrode GE5 may be provided as a part of the emission control line Ei or may have a shape protruding from the emission control line Ei. Each of the fifth active pattern ACTS, the fifth source electrode SE5, and the fifth drain electrode DE5 may include an undoped semiconductor layer or a semiconductor layer doped with an impurity. For example, each of the fifth source electrode SE5 and the fifth drain electrode DE5 may include a semiconductor layer doped with an impurity. The fifth active pattern ACTS may include an undoped semiconductor layer and may correspond to a portion of the fifth transistor M5 that overlaps the fifth gate electrode GE5. The fifth source electrode SE5 may have a first end coupled to the fifth active pattern ACTS and a second end coupled to the power line PL through a fifth contact hole CH5. The fifth drain electrode DE5 may have a first end coupled to the fifth active pattern ACT5 and a second end coupled with the source electrode SE of the drive transistor MD and the second drain electrode DE2 of the second transistor M5.

The sixth transistor M6 may include a sixth gate electrode GE6, a sixth active pattern ACT6, the sixth source electrode SE6, and a sixth drain electrode DE6. The sixth gate electrode GE6 may be coupled to the emission control line Ei and may be provided as a part of the emission control line Ei, or may have a shape protruding from the emission control line Ei. Each of the sixth active pattern ACT6, the sixth source electrode SE6, and the sixth drain electrode DE6 may include an undoped semiconductor layer or a semiconductor layer doped with an impurity. For example, each of the sixth source electrode SE6 and the sixth drain electrode DE6 may include a semiconductor layer doped with an impurity. The sixth active pattern ACT6 may include an undoped semiconductor layer and may correspond to a portion of the sixth transistor M6 that overlaps the sixth gate electrode GE6. The sixth source electrode SE6 may have a first end coupled to the sixth active pattern ACT6 and a second end coupled with the drain electrode DE of the drive transistor MD and the fourth source electrode SE4 of the fourth transistor M4. The sixth drain electrode DE6 may have a first end coupled to the sixth active pattern ACT6 and a second end coupled to a first source electrode SE1 of the first transistor M1.

The first transistor M1 may include a first gate electrode GE1, a first active pattern ACT1, the first source electrode SE1, and the first drain electrode DE1. The first gate electrode GE1 may be coupled to the i-th scan line Si and may be provided as a part of the i-th scan line Si or may have a shape protruding from the i-th scan line Si. Each of the first active pattern ACT1, the first source electrode SE1, and the first drain electrode DE1 may include an undoped semiconductor layer or a semiconductor layer doped with an impurity. For example, each of the first source electrode SE1 and the first drain electrode DE1 may include a semiconductor layer doped with an impurity. The first active pattern ACT1 may include an undoped semiconductor layer. The first active pattern ACT1 may correspond to a portion of the first transistor M1 that overlaps the first gate electrode GE1. The first source electrode SE1 may have a first end coupled to the first active pattern ACT1 and a second end coupled to the sixth drain electrode DE6 of the sixth transistor M6. The first drain electrode DE1 may have a first end coupled to the first active pattern ACT1 and a second end coupled to the fourth power line IPL2. The first drain electrode DE1 may be coupled to the third source electrode SE3 of a pixel provided on an i+1-th horizontal line. The first drain electrode DE1 and the third source electrode SE3 of the pixel on the i+1-th horizontal line may be coupled with each other through the auxiliary line AUX, eighth contact hole CH8, and ninth contact hole CH9.

The storage capacitor Cst may include a lower electrode LE and an upper electrode UE. The lower electrode LE may be formed of the first gate electrode GE1 of the drive transistor MD. The upper electrode US may overlap the gate electrode GE and cover the lower electrode LE in a plan view.

The capacity of the storage capacity Cst may be increased by increasing the overlapping area between the upper electrode UE and the lower electrode LE. The upper electrode UE may extend in the first direction DR1. In one embodiment, a voltage having the same level as that of the first power supply may be applied to the upper electrode UE. The upper electrode UE may include an opening OPN in an area having the first contact hole CH1 through which the gate electrode GE makes contact with the connection line CNL.

The OLED may include a first electrode AD, a second electrode CD, and a light-emitting layer EML between the first electrode AD and the second electrode CD. The first electrode AD may be in an emission area corresponding to each pixel 140, and may be coupled to the first source electrode SE1 of the first transistor M1 and the sixth drain electrode DE6 of the sixth transistor M6 through a seventh contact hole CH7 and a tenth contact hole CH10. A bridge pattern BRP may be between the seventh contact hole CH7 and the tenth contact hole CH10, and may couple the sixth drain electrode DE6, the first source electrode SE1, and the first electrode AD to each other.

Referring again to FIGS. 4 to 7, the active patterns ACT and ACT1 to ACT6 may be on the substrate SUB and may include a semiconductor material. A buffer layer may be between the substrate SUB and the active patterns. A gate insulating layer GI may be on the substrate SUB on which the active patterns have been formed.

The i−1-th scan line Si−1, the i-th scan line Si, the emission control line Ei, the gate electrode GE, and the first to sixth gate electrodes GE1 to GE6 may be on the gate insulating layer GI. The gate electrode GE may be the lower electrode LE of the storage capacity Cst. The second gate electrode GE2 and the fourth gate electrode GE4 may be integrally formed with the i-th scan line Si. The third gate electrode GE3 may be integrally formed with the i−1-th scan line Si−1. The fifth gate electrode GE5 and the sixth gate electrode GE6 may be integrally formed with the emission control line Ei. The seventh gate electrode GE7 may be integrally formed with the i-th scan line Si.

A first insulating layer IL1 may be on the substrate SUB on which the i−1-th scan line Si−1, etc., have been formed.

The upper electrode UE of the storage capacitor Cst and the fourth power line IPL2 may be on the first insulating layer IL1. The upper electrode UE may cover the lower electrode LE and may form the storage capacitor Cst along with the lower electrode LE and intervening first insulating layer IL1.

The second insulating layer IL2 may be on the upper electrode UE and the substrate SUB on which the fourth power line IPL2 has been disposed.

The data line Dm, the power line PL, the connection line CNL, the auxiliary connection line AUX, and the bridge pattern BRP may be on the second insulating layer IL2. The data line Dm may be coupled to the second source electrode SE2 through the sixth contact hole CH6 passing through the first insulating layer IL1, the second insulating layer IL2, and the gate insulating layer GI.

The power line PL may be coupled to the fifth source electrode SE5 through the fifth contact hole CH5 passing through the first insulating layer IL1, the second insulating layer IL2, and the gate insulating layer GI.

The connection line CNL may be coupled to the gate electrode GE through the first contact hole CH1 passing through the first insulating layer IL1 and the second insulating layer IL2. The connection line CNL may be coupled to the third drain electrode DE3 and the fourth drain electrode DE4 through the second contact hole CH2 passing through the gate insulating layer GI, the first insulating layer IL1 and the second insulating layer IL2.

The, auxiliary connection line AUX may be coupled to the fourth power line IPL2 through the eighth contact hole CH8 passing through the second insulating layer IL2. The auxiliary connection line AUX may be coupled to the third source electrode SE3 and the first drain electrode DE1 of the pixel in the i–1-th horizontal line through the ninth contact hole CH9 passing through the gate insulating layer GI, the first insulating layer IL1, and the second insulating layer IL2.

The bridge pattern BRP may be between the sixth drain electrode DE6 and the first electrode AD and serve as a medium coupling the sixth drain electrode DE6 to the first electrode AD. The bridge pattern BRP may be coupled to the sixth drain electrode DE6 and the first source electrode SE1 through the seventh contact hole CH7 passing through the gate insulating layer GI, the first insulating layer IL 1, and the second insulating layer IL2.

A protective layer PSV may be on the substrate SUB on which the data line Dm, etc., have been formed.

The third power line IPL1 and the OLED may be on the protective layer PSV. The OLED may include the first electrode AD, the second electrode CD, and the light-emitting layer EML between the first electrode AD and the second electrode CD.

The first electrode AD may be on the protective layer PSV and may be coupled to the bridge pattern BRP through the tenth contact hole CH10 passing through the protective layer PSV. Since the bridge pattern BRP is coupled the sixth drain electrode DE6 and the first source electrode SE1 through the seventh contact hole CH7, the first electrode AD may ultimately be electrically coupled to the sixth drain electrode DE6 and the first source electrode SE1.

A pixel defining layer PDL (for defining an emission area corresponding to each pixel 140) may be on the substrate SUB on which the first electrode AD, etc., have been formed. The pixel defining layer PDL may expose an upper surface of the first electrode AD and protrude from the substrate SUB along the periphery of the pixel 140.

The light-emitting layer EML may be in the emission area enclosed by the pixel defining layer PDL. The second electrode CD may be on the light-emitting layer EML.

One of the first electrode AD or the second electrode CD may be an anode electrode and the other one may be a cathode electrode. For example, the first electrode AD may be an anode electrode and the second electrode CD may be a cathode electrode.

At least one of the first electrode AD or the second electrode CD may be a transmissive electrode. For example, when the OLED is a bottom emission type OLED, the first electrode AD may be a transmissive electrode and the second electrode CD may be a reflective electrode. When the OLED is a top emission type OLED, the first electrode AD may be a reflective electrode and the second electrode CD may be a transmissive electrode. When the OLED is a double-side emission type OLED, the first electrode AD and the second electrode CD may be transmissive electrodes. In the present embodiment, there is illustrated an example in which the OLED is a front emission type OLED and the first electrode AD is an anode electrode.

The first electrode AD may include a reflective layer which reflects light, and a transparent conductive layer on or under the reflective layer. At least one of the transparent conductive layer or the reflective layer may be coupled with the first source electrode SE1. The reflective layer may include material that is able to reflect light. For example, the reflective layer may include at least one of aluminum (Al), silver (Ag), chrome (Cr), molybdenum (Mo), platinum (Pt), nickel (Ni), or an alloy thereof.

The transparent conductive layer may include transparent conductive oxide. For example, the transparent conductive layer may include at least one transparent conductive oxide of ITO (Indium Tin Oxide), IZO (Indium Zinc Oxide), AZO (Aluminum Zinc Oxide), GZO (gallium doped zinc oxide), ZTO (zinc tin oxide), GTO (Gallium tin oxide), or FTO (fluorine doped tin oxide).

The pixel defining layer PDL may include organic insulating material. For example, the pixel defining layer PDL may include at least one of polystyrene, PMMA (polymethylmethacrylate), PAN (polyacrylonitrile), PA (polyamide), PI (polyimide), PAE (polyarylether), heterocyclic polymer, parylene, epoxy, BCB (benzocyclobutene), siloxane based resin, or silane based resin.

The light-emitting layer EML may be on the exposed surface of the first electrode AD, and may have a multilayer thin-film structure including at least a light generation layer (LGL). For instance, the light-emitting layer EML may include a hole injection layer (HIL) into which holes are injected and a hole transport layer (HTL) which has excellent hole transportation performance and restrains movement of electrons that have not been coupled with holes in the light generation layer and thus increases chances of recombination between holes and electrons, a light generation layer which emits light based on recombination between injected electrons and holes, a hole blocking layer (HBL) which restrains movement of holes that have not been coupled with electrons in the light generation layer, an electron transport layer (ETL) provided to smoothly transport electrons to the light generation layer; and an electron injection layer (EIL) into which electrons are injected.

The color of light generated from the light generation layer may be, for example, one of red, green, blue, or white. For example, the color of light from the light generation layer of the light-emitting layer EML may be one of magenta, cyan, or yellow.

The hole injection layer, the hole transport layer, the hole blocking layer, the electron transport layer, and the electron injection layer may be, for example, common layers coupled between adjacent emission areas.

The second electrode CD may be a semi-transmissive reflective layer. For example, the second electrode CD may be a thin metal layer having a thickness allowing light emitted from the light-emitting layer EML to transmit therethrough. The second electrode CD may allow some of the light generated from the light-emitting layer EML to pass therethrough and may reflect the rest of the light generated from the light-emitting layer EML.

The second electrode CD may include material having a work function lower than that of the transparent conductive layer. For instance, the second electrode CD may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy of them.

Some of the light emitted from the light-emitting layer EML may not transmit through the second electrode CD, and light reflected by the second electrode CD is reflected by the reflective layer again. For example, light emitted form the light-emitting layer EML may resonate between the reflective layer and the second electrode CD. The light extraction efficiency of display elements (OLEDs) may be enhanced by the resonance of light.

The distance between the reflective layer and the second electrode CD may change depending on the color of light emitted from the light-emitting layer EML. For example, depending on the color of light emitted from the light-emitting layer EML, the distance between the reflective layer and the second electrode CD may be adjusted to correspond to a resonance distance.

The third power line IPL1 may be on the same layer as that of the first electrode AD (e.g., on the protective layer PSV) and may be covered by the pixel defining layer PDL. The third power line IPL1 may include the same material as the first electrode AD. The third power line IPL1 may include a reflective layer which reflects light, and a transparent conductive layer on or under the reflective layer.

The third power line IPL1 may be coupled to the auxiliary connection line AUX through the twelfth contact hole CH12 passing through the protective layer PSV and thus coupled to the first drain electrode DE1 of the first transistor M1.

As shown in FIG. 5, the third power line IPL1 may be bent or a portion thereof may protrude or extend to cover at least a portion of the third transistor M3 or at least a portion of the fourth transistor M4. The third power line IPL1 may block external light from being incident on the third or fourth transistor M3 or M4. If external light is incident on the third or fourth transistor M3 or M4, the third or fourth transistor M3 or M4 may malfunction and image quality of the organic light-emitting display device may be reduced. On the other hand, in the present embodiment, the third and fourth transistors M3 and M4 may be prevented from malfunctioning because a portion of the third power line IPL1 covers at least a portion of the third transistor M3 and at least a portion of the fourth transistor M4. Consequently, the image quality of the organic light-emitting display device may be prevented from being reduced.

An encapsulating layer SLM covering the second electrode CD may be on the second electrode CD. The encapsulating layer SLM may prevent oxygen or water from permeating the OLED. The encapsulating layer SLM may include, for example, one or more inorganic layers and one or more organic layers. In one embodiment, the encapsulating layer SLM may include a plurality of unit encapsulating layers including an inorganic layer and an organic layer on the inorganic layer. An inorganic layer may be in an uppermost portion of the encapsulating layer SLM and may include at least one of silicon oxide, silicon nitride, silicon oxynitride, aluminum oxide, titanium oxide, zirconium oxide, or tin oxide.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The drivers, controllers, and other signal generating and signal-processing features of the embodiments disclosed herein may be implemented in logic which, for example, may include hardware, software, or both. When implemented at least partially in hardware, the drivers, controllers, and other signal generating and signal-processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the drivers, controllers, and other signal generating and signal-processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, an organic light-emitting display device includes a gate electrode of a drive transistor that is initialized using a first initialization power supply. An anode electrode voltage of an organic light-emitting diode is initialized using a second initialization power supply. Because the first initialization power supply and the second initialization power supply are separated from each other, the first initialization power supply may be set to a voltage higher than a voltage of the second initialization power supply. This may reduce or minimize leakage current and improve image quality of the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. An organic light-emitting display device, comprising:
pixels coupled to scan lines, data lines, and emission control lines;
a scan driver to supply a scan signal to the scan lines;
an emission control driver to supply an emission control signal to the emission control lines; and
a data driver to supply data signals to the data lines, wherein each of pixels in an i-th (i is a natural number) horizontal line includes:
an organic light-emitting diode including a cathode electrode coupled to a second power supply;
a pixel circuit including a drive transistor to control an amount of current flowing from a first power supply to a second power supply via the organic light-emitting diode;
a third transistor coupled between a third power supply and a gate electrode of the drive transistor, the third transistor to be turned on when the scan signal is supplied to an i−1-th scan line, the third transistor to receive a voltage of the third power supply through a third power line;
a first transistor coupled between a fourth power supply and an anode electrode of the organic light-emitting diode, the first transistor to be turned on when the scan signal is supplied to an i-th scan line, the fourth power supply being different from the third power supply and the second power supply, and the first transistor to receive a voltage of the fourth power supply through a fourth power line; and
a second transistor coupled between the data line and the pixel circuit, the second transistor to be turned on when the scan signal is supplied to the i-th scan line,
wherein
the third power line, the fourth power line and a power line for supplying the first power supply are on different layers, and
the third power line covers at least a portion of the third transistor.

2. The display device as claimed in claim 1, wherein:
the scan lines and the emission control lines are on a substrate,
the data lines are on a gate insulating layer on the scan lines and the emission control lines, and
the organic light-emitting display device includes a first insulating layer, a second insulating layer, and a protective layer successively stacked on the gate insulating layer.

3. The display device as claimed in claim 2, wherein:
the third power line is on the first insulating layer, and
the fourth power line and the anode electrode are on the protective layer.

4. The display device as claimed in claim 3, wherein the fourth power line includes a same material as the anode electrode.

5. The display device as claimed in claim 4, wherein the anode electrode includes:
a reflective layer on the protective layer; and
a transparent conductive layer between the reflective layer and the protective layer or on the reflective layer.

6. The display device as claimed in claim 2, wherein the pixel circuit includes:
at least one fourth transistor coupled between the gate electrode of the drive transistor and a second electrode of the drive transistor, the at least one fourth transistor to be turned on based on the scan signal supplied to the i-th scan line;
a fifth transistor coupled between a first electrode of the drive transistor and the first power supply, the fifth transistor to be turned off based on the emission control signal supplied to an i-th emission control line; and
a sixth transistor coupled between the second electrode of the drive transistor and the anode electrode of the organic light-emitting diode, the sixth transistor to be turned off based on the emission control signal supplied to the i-th emission control line.

7. The display device as claimed in claim 6, wherein:
the emission control driver supplies the emission control signal to the fifth transistor through the i-th emission control line, and
the emission control signal overlaps the scan signal supplied to the i−1-th scan line and the i-th scan line.

8. The display device as claimed in claim 7, wherein the third power line further covers at least a portion of the fourth transistor.

9. The display device as claimed in claim 8, wherein the third power line includes:
a reflective layer on the protective layer; and
a transparent conductive layer between the reflective layer and the protective layer or on the reflective layer.

10. The display device as claimed in claim 6, wherein the second transistor is coupled to the first electrode of the drive transistor.

11. The display device as claimed in claim 6, wherein:
the pixel circuit includes a storage capacitor coupled between the first power supply and the third transistor, the storage capacitor including:
a lower electrode on the gate insulating layer; and
an upper electrode on the first insulating layer.

12. The display device as claimed in claim 11, wherein the fourth power line is on a same layer as the upper electrode.

13. The display device as claimed in claim 1, wherein:
the third power supply is a first initialization power supply to initialize the gate electrode of the drive transistor, and
the fourth power supply is a second initialization power supply to initialize the anode electrode of the organic light-emitting diode.

14. The display device as claimed in claim 13, wherein the third power supply is output to a voltage higher than a voltage of the fourth power supply.

15. The display device as claimed in claim 13, wherein the fourth power supply is output to a voltage higher than the second power supply.

16. The display device as claimed in claim 13, wherein the third power supply is output to a voltage lower than each of the data signals.

* * * * *